US011652166B2

(12) United States Patent
Lee et al.

(10) Patent No.: US 11,652,166 B2
(45) Date of Patent: May 16, 2023

(54) POWER DEVICE HAVING SUPER JUNCTION AND SCHOTTKY DIODE

(71) Applicant: SEMICONDUCTOR COMPONENTS INDUSTRIES, LLC, Phoenix, AZ (US)

(72) Inventors: Wonhwa Lee, Bucheon-si (KR); Gary H. Loechelt, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 314 days.

(21) Appl. No.: 16/871,268

(22) Filed: May 11, 2020

(65) Prior Publication Data
US 2020/0273981 A1  Aug. 27, 2020

Related U.S. Application Data

(62) Division of application No. 16/009,484, filed on Jun. 15, 2018, now Pat. No. 10,680,095.

(51) Int. Cl.
| H01L 29/78 | (2006.01) |
| H01L 29/10 | (2006.01) |
| H01L 29/06 | (2006.01) |
| H01L 29/739 | (2006.01) |
| H01L 21/306 | (2006.01) |
| H01L 29/47 | (2006.01) |
| H01L 21/311 | (2006.01) |
| H01L 21/265 | (2006.01) |
| H01L 29/66 | (2006.01) |

(Continued)

(52) U.S. Cl.
CPC .... H01L 29/7806 (2013.01); H01L 21/26513 (2013.01); H01L 21/30604 (2013.01); H01L 21/31111 (2013.01); H01L 29/0634 (2013.01); H01L 29/1095 (2013.01); H01L 29/47 (2013.01); H01L 29/66143 (2013.01); H01L 29/66333 (2013.01); H01L 29/66712 (2013.01); H01L 29/7395 (2013.01); H01L 29/7811 (2013.01); H01L 29/872 (2013.01); H01L 21/266 (2013.01); H01L 29/36 (2013.01)

(58) Field of Classification Search
CPC ............... H01L 29/0634; H01L 29/872; H01L 29/1095
See application file for complete search history.

(56) References Cited

U.S. PATENT DOCUMENTS 7,268,403 B2  9/2007 Kim
8,704,295 B1  4/2014 Darwish et al.
(Continued)

Primary Examiner — Fernando L Toledo
Assistant Examiner — Valerie N Newton
(74) Attorney, Agent, or Firm — Brake Hughes Bellermann LLP

(57) ABSTRACT

A method of forming a power semiconductor device includes providing an epi layer over a substrate; forming a well at an upper portion of the epi layer; forming a pillar below the well and spaced apart from the well to define a Schottky contact region; etching a trench into the epi layer, the trench having a sidewall and a base, a portion of the sidewall of the trench corresponding to the Schottky contact region; forming a metal contact layer over the sidewall and the base of the trench, the metal contact layer forming a Schottky interface with the epi layer at the Schottky contact region; and forming a gate electrode and first and second electrodes.

21 Claims, 18 Drawing Sheets

(51) Int. Cl.
  *H01L 29/872*  (2006.01)
  *H01L 21/266*  (2006.01)
  *H01L 29/36*  (2006.01)

(56) References Cited

U.S. PATENT DOCUMENTS

| | | |
|---|---|---|
| 8,928,050 B2 | 1/2015 | Loechelt et al. |
| 9,076,861 B2 | 7/2015 | Darwish et al. |
| 9,711,636 B2 | 7/2017 | Guo et al. |
| 2005/0082570 A1 | 4/2005 | Sridevan |
| 2007/0179225 A1 | 8/2007 | Shiping |
| 2012/0306009 A1 | 12/2012 | Kim |
| 2019/0074385 A1* | 3/2019 | Lee ........................ H01L 29/872 |
| 2019/0348510 A1* | 11/2019 | Yilmaz ............. H01L 29/66348 |

* cited by examiner

POWER DEVICE HAVING SUPER JUNCTION AND SCHOTTKY DIODE

CROSS-REFERENCE TO RELATED APPLICATION

This application is a divisional application of U.S. patent application Ser. No. 16/009,484, filed on Jun. 15, 2018, the entire contents of which is incorporated by reference herein in its entirety.

BACKGROUND

The present disclosure relates to a power semiconductor device, in particular a power device having a super junction structure and a Schottky diode.

Power semiconductor devices are used in many different industries. Some of these industries, such as telecommunications, computing and charging systems, are rapidly developing. Those industries would benefit from improved semiconductor device characteristics, including reliability, switching speed, and miniaturization.

Recent efforts to improve power semiconductor device characteristics include creating a Schottky barrier region that is separate from a transistor region. A separate Schottky barrier region reduces leakage current and improves reverse recovery characteristics. However, there is still room for improvements to the structure of power semiconductor devices to meet the demands for higher system efficiency through lower forward voltage (VF), faster reverse recovery performance and better reliability of emerging technologies.

SUMMARY

Embodiments of the present application relate to a power semiconductor device having a super junction and a Schottky diode, where the Schottky diode is integrated into the unit cell of the power device. The device has lower forward voltage (VF) and reduced reverse recovery time compared to conventional power devices.

A power semiconductor device includes a semiconductor layer having a first conductivity type. A trench is defined within the semiconductor layer, the trench having an opening, a sidewall and a base. A pillar is provided below the trench and has a second conductivity type that is different than the first conductivity type. A metal layer is provided over the sidewall of the trench, the metal layer contacting the semiconductor layer at the sidewall of the trench to form a Schottky interface of a Schottky diode. A first electrode is provided over a first side of the semiconductor layer. A second electrode is provided over a second side of the semiconductor layer.

A power semiconductor device includes a substrate having an upper side and a lower side. A first electrode is disposed over the upper side of the substrate. A second electrode is disposed below the lower side of the substrate. An epi layer is formed over the substrate and between the first and second electrodes, the epi layer having a pillar and a well, the pillar and the well defining a gap. A trench is disposed over the pillar having a sidewall and a base, the base of the trench being recessed into the pillar. A metal contact layer is disposed over the base and the sidewall of the trench, the metal contact layer contacting the epi layer at the gap defined by the well and the pillar, thereby defining a Schottky interface at the gap.

A method of forming a power semiconductor device includes providing an epi layer over a substrate; forming a well at an upper portion of the epi layer; forming a pillar below the well and spaced apart from the well to define a Schottky contact region; etching a trench into the epi layer, the trench having a sidewall and a base, a portion of the sidewall of the trench corresponding to the Schottky contact region; forming a metal contact layer over the sidewall and the base of the trench, the metal contact layer forming a Schottky interface with the epi layer at the Schottky contact region; and forming a gate electrode and first and second electrodes.

DETAILED DESCRIPTION

Embodiments of the present application relate to a power semiconductor device having a super junction and a Schottky diode. The Schottky diode is integrated into the unit cell of the power device, so that the Schottky diode does not consume any more area than the unit cell of the power device. The Schottky diode also provides a good current path between the super junction pillar and the source/emitter of the power device to minimize the dynamic switching problems and catastrophic failure under high-current avalanche. The Schottky diode may also be provided with adequate shielding, e.g., a highly doped region adjacent to the Schottky contact region (or Schottky interface) to reduce current leakage under reverse bias. In an embodiment, the power device is configured to have low epi resistivity and handle high breakdown voltage, e.g., greater than 300 voltage, or greater than 500 voltage, or greater than 700 voltages.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
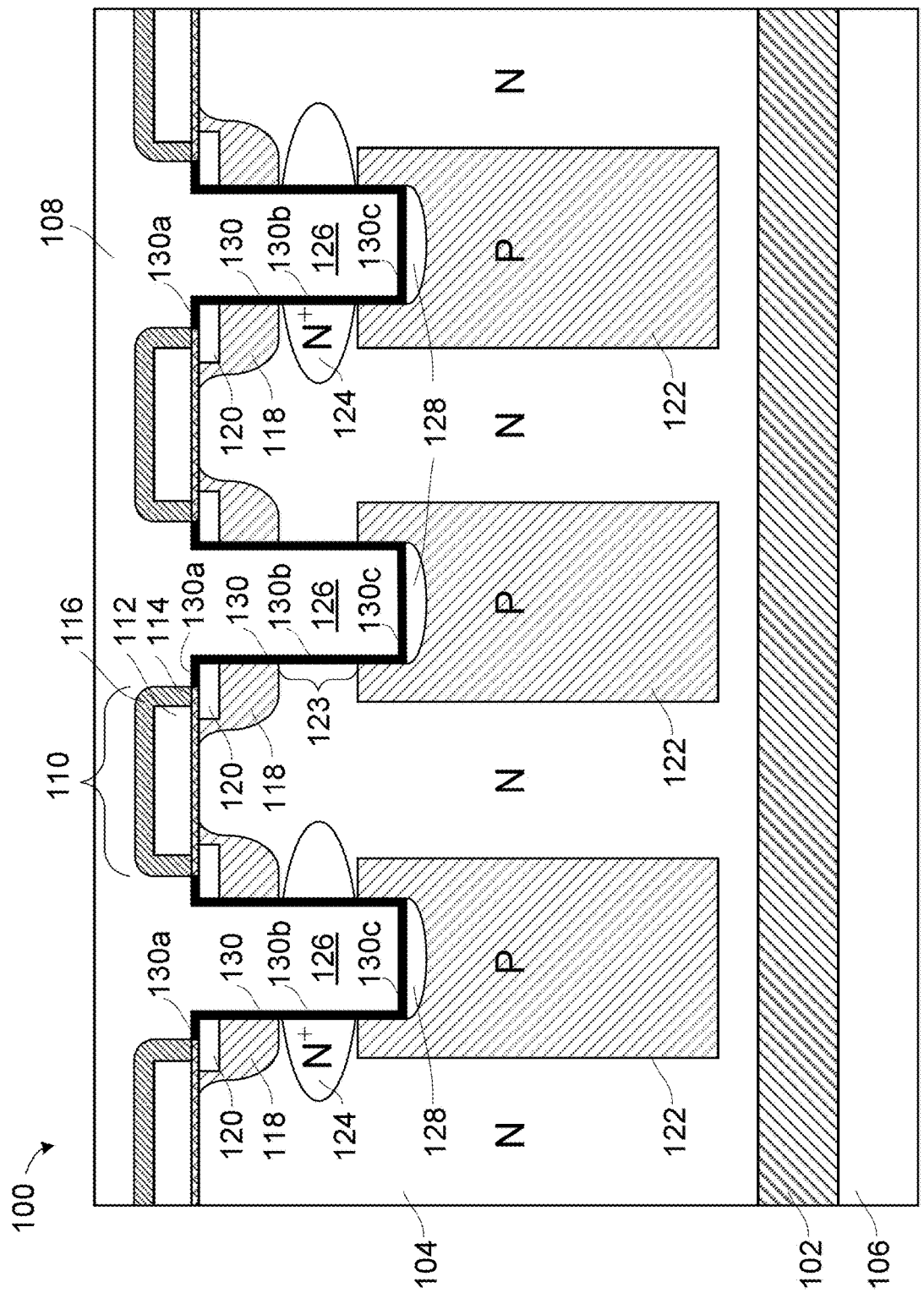
FIGS. 1A-1C illustrate a power semiconductor device having a super junction structure and a Schottky diode according to an embodiment.

FIG. 1 illustrates a power semiconductor device 100 according to an embodiment of the present disclosure. In the present embodiment, the power device 100 is a power metal oxide semiconductor field effect transistor (MOSFET) device with a super junction structure (or pillars). In other embodiment, the power device 100 may be other power devices such as an insulated gate bipolar transistor (IGBT) device. If the power device 100 is an IGBT, it would have an additional P+ substrate or layer, as would be understood by one skilled in the art.

The power device 100 includes a semiconductor substrate 102, for example silicon substrate. An epitaxial layer 104 (or epi layer) is provided on a first side of the substrate 102, and a first electrode 106 is provided on or over a second side of the substrate 102. In an embodiment, the epi layer 104 has N type conductivity. A second electrode 108 is provided over the epi layer 104. A plurality of gate structures 110 are provided over the epi layer 104 and proximate to the second electrode 108. The epi layer 104 provides a current path for the first and second electrodes 106 and 108 when the gate structure 110 is turned on. In the present embodiment, the power device 100 is a power MOSFET and the first and second electrodes 106 and 108 are drain and source electrodes, respectively. In another embodiment, the power device may be an IGBT and the first and second electrodes 106 and 108 may be collector and emitter electrodes, respectively.

Each of the gate structures 110 includes a gate electrode 112, a gate oxide 114 and a gate spacer 116. A plurality of wells 118 are provided in the epi layer, between the gate structures 110. The depth of the well 118 may depend on the characteristics of the power device 100. In an embodiment, the depth of the well ranges between about 1 micron to about 2 microns, or may be up to 5 microns. In an embodiment, the wells 118 have P conductivity and form a body diode with the epi layer 104. The dopant concentration of the P wells 118 is around between $1.2 \times 10^{16}$ atoms/cm$^3$ and $8.0 \times 10^{17}$ atoms/cm$^3$. A plurality of N+ regions 120 are provided within the P wells 118 and proximate the gate electrode 112. In an embodiment, the N+ region 120 is a source region.

A plurality of pillars 122 (or super junction structures) are disposed in the epi layer 104. Each pillar is spaced apart from the P well 118, defining a gap 123 of 1-5 microns, or from 2-3 microns depending on implementation. This vertical gap 123 defines a Schottky diode region, and its size may vary depending on implementation. In an embodiment, the pillars 122 have P type conductivity, and have a dopant concentration of about $10^{16}$ atoms/cm$^3$. In an embodiment, the pillar 122 has a vertical dimension of at least 20 microns or at least 25 microns. In another embodiment, the pillar 122 may have a vertical dimension of about 30 microns to about 60 microns depending on implementation. For example, for a 600-650 V device, the pillars have a vertical dimension of about 45-50 microns in an implementation.

Figure 1B:
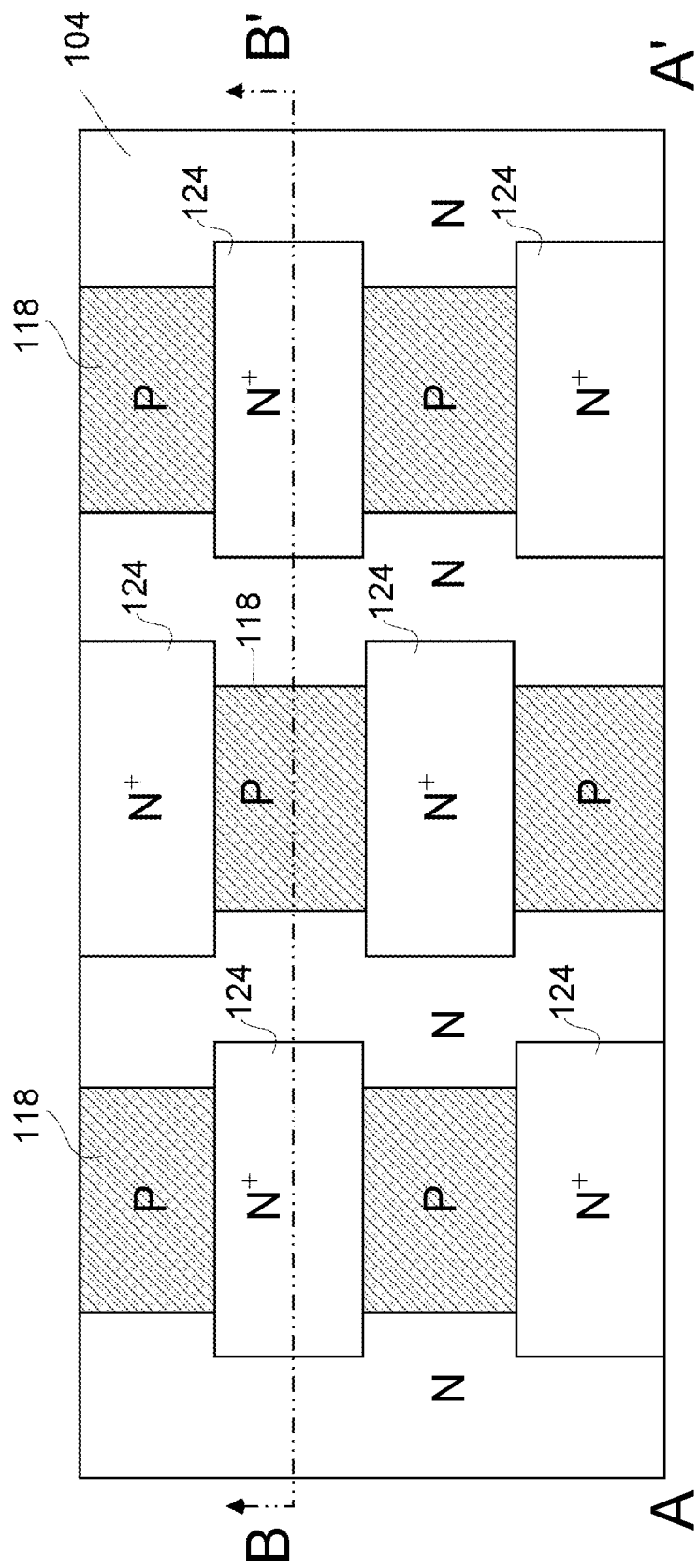
Figure 1C:
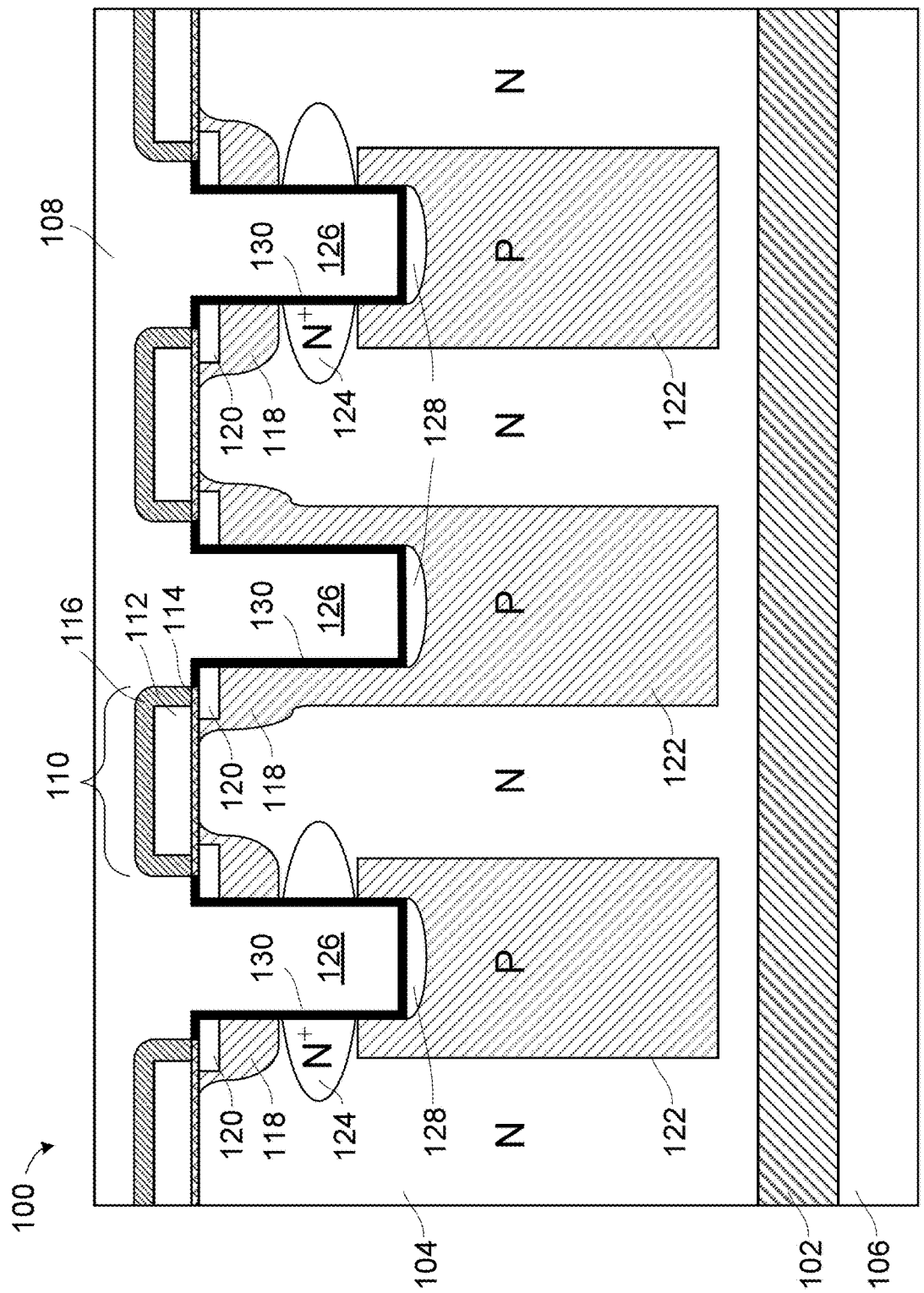

In an embodiment, a plurality of N+ enhancement regions 124 are provided in the gap 123 defined by the P wells and the pillars. The N+ enhancement regions 124 are provided to decrease the forward voltage drop of body diode and reduce the current leakage under reverse bias. In an embodiment, the N+ enhancement regions 124 are provided in an alternating pattern as shown in FIG. 1B, which show a top view of the N+ enhancement regions 124 and the P wells 118. In another embodiment, gaps 123 may be present only where there is a corresponding N+ enhancement region 124 and absent elsewhere, as shown in FIG. 1C. In this embodiment, P wells 118 and P pillars 122 overlap in regions where N+ enhancement regions 124 are absent. In still another embodiment, the N+ enhancement regions 124 are not provided.

A plurality of trenches 126 extends from an upper surface of the epi layer 104 and into an upper portion of the P pillars 122. The trenches 126 extend through the N+ source regions 120 and partly into the P wells 118, so that the bases or bottoms of the trenches reside in the P pillars 122. In an embodiment, the trench 126 extends about 1 micron to about 8 microns into the P pillars.

A plurality of Ohmic contact regions 128 are provided below the base of the trenches 126. In an embodiment, the Ohmic contact regions 128 are formed by providing additional P type impurities, e.g., boron, to the upper portion of the P pillars 122. In an embodiment, Ohmic contact regions 128 have a significantly higher dopant concentration than that of the P pillars 122. For example, the P pillars have a dopant concentration of about $10^{16}$ atoms/cm$^3$, and the Ohmic contact regions 128 have a dopant concentration of about $10^{19}$ atoms/cm$^3$, which is 3 orders of magnitude as great as the dopant concentration of the P pillars 122.

A Schottky contact layer 130 is disposed over surfaces of the trenches 126. The Schottky contact layer 130 includes upper portions 130a, side portions 130b, and a bottom portion (or base) 130c. The upper portions 130a of the Schottky contact layer 130 extend beyond the trench and abut sides of the gate structures 110. The side portions 130b of the Schottky contact layer 130 contacts the gap 123 defined by the P well 118 and the P pillar 122, thereby defining the Schottky contacts (Schottky interfaces). These Schottky contact define a Schottky diode where the anode is connected to (or corresponds to) the source electrode 108 and a cathode is connected to (or corresponds to) the drain electrode 106. The Schottky diode reduces the forward voltage (VF) and reverse recovery time for the power device 100. Since the Schottky contact is formed between the P well 118 and the P pillar 122, the Schottky diode is integrated into the unit cell of the power device 100. As a result, the Schottky diode does not consume any more area than the unit cell of the power device 100.

In addition, the bottom portion 130c of the Schottky contact layer 130 makes an Ohmic contact with the Ohmic contact regions 128. The Ohmic contact results in a good current path between the pillar 122 and the second electrode 108 (e.g., source electrode), which reduces the likelihood of dynamic switching problems and catastrophic failure under high-current avalanche conditions.

The Schottky contact layer 130, which forms a Schottky diode, may include a metal material such as Molybdenum (Mo), Platinum (Pt), Vanadium (V), Titanium (Ti), Palladium (Pd), etc. In another embodiment, the Schottky contact layer 130 is a silicide material, such as platinum or palladium silicide.

Figure 2:
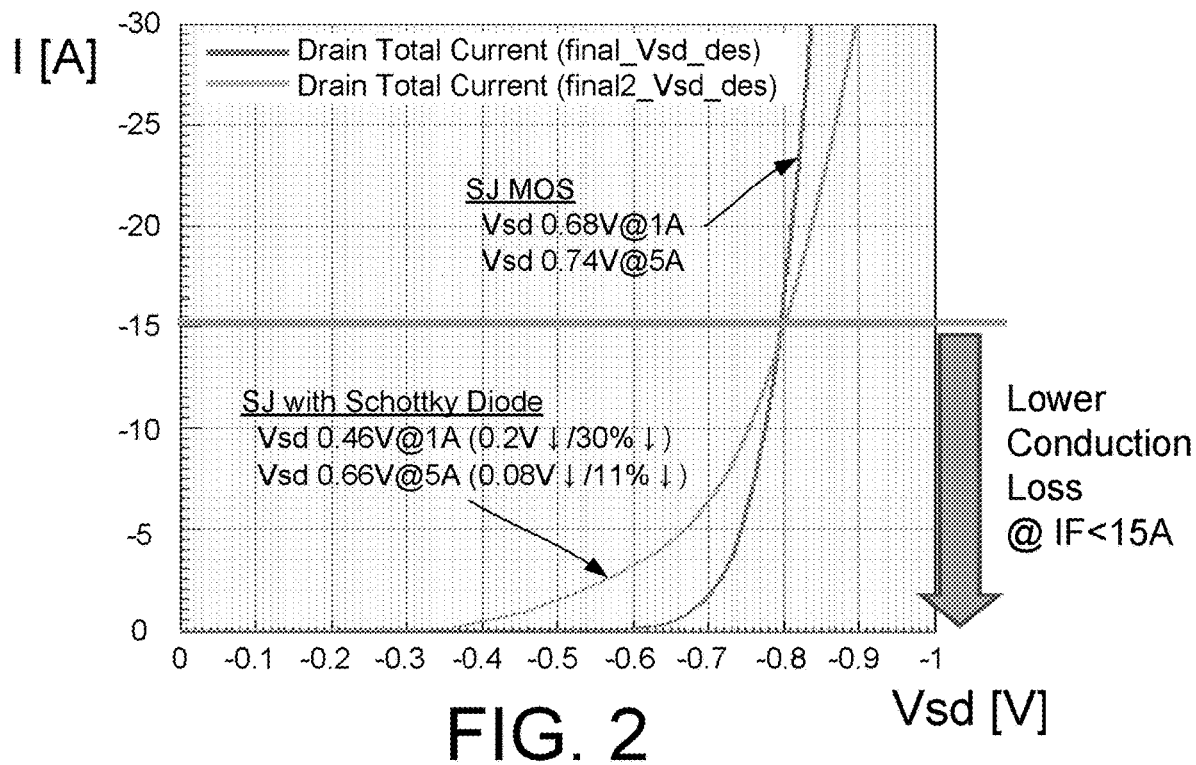
FIG. 2 illustrates a comparison on conduction loss between a conventional power device and a power device according to an embodiment.

As explained above, the power device 100 having a Schottky diode has certain advantages. FIG. 2 illustrates waveforms of currents flowing through two power devices as a function of a source-drain voltage $V_{SD}$: "SJ MOS" represents a conventional super junction MOSFET device and "SJ with Schottky Diode" represents the power device 100. In experiment, it has been found that the source-drain voltage $V_{SD}$ of SJ with Schottky diode (or the power device 100) is lower than that of the conventional super junction MOSFET, especially at current levels below 15 A. For example, while the conventional super junction MOSFET has a source-drain voltage $V_{SD}$ of 0.68V at 1 A, the source-drain voltage $V_{SD}$ of the power device 100 is 0.46V at 1 A, which is about 30% lower than that of the conventional super junction MOSFET. It is believed that the Schottky diode lowers the source-drain voltage $V_{SD}$ of the power device 100 since Schottky diode has a lower forward voltage than a PN diode.

Similarly, while a conventional super junction MOSFET has a source-drain voltage $V_{SD}$ of 0.74V at 5 A, a super junction MOSFET with a vertical Schottky diode (or the power device 100) is 0.66V at 5A, which is about 11% lower than that of the conventional super junction MOSFET device. The power device 100 has a lower a source-drain voltage $V_{SD}$ than the conventional MOSFET since the Schottky diode in the power device 100 has a lower forward voltage drop than a PN junction diode found in a conventional super junction MOSFET (for example, 0.2V~0.5V compared to 0.7 V). Accordingly, the power device 100 having a Schottky diode has less body diode conduction loss than that of the conventional super junction MOSFET, thereby increasing power efficiency in applications including an inverter and DC-DC power conversion.

Figure 3:
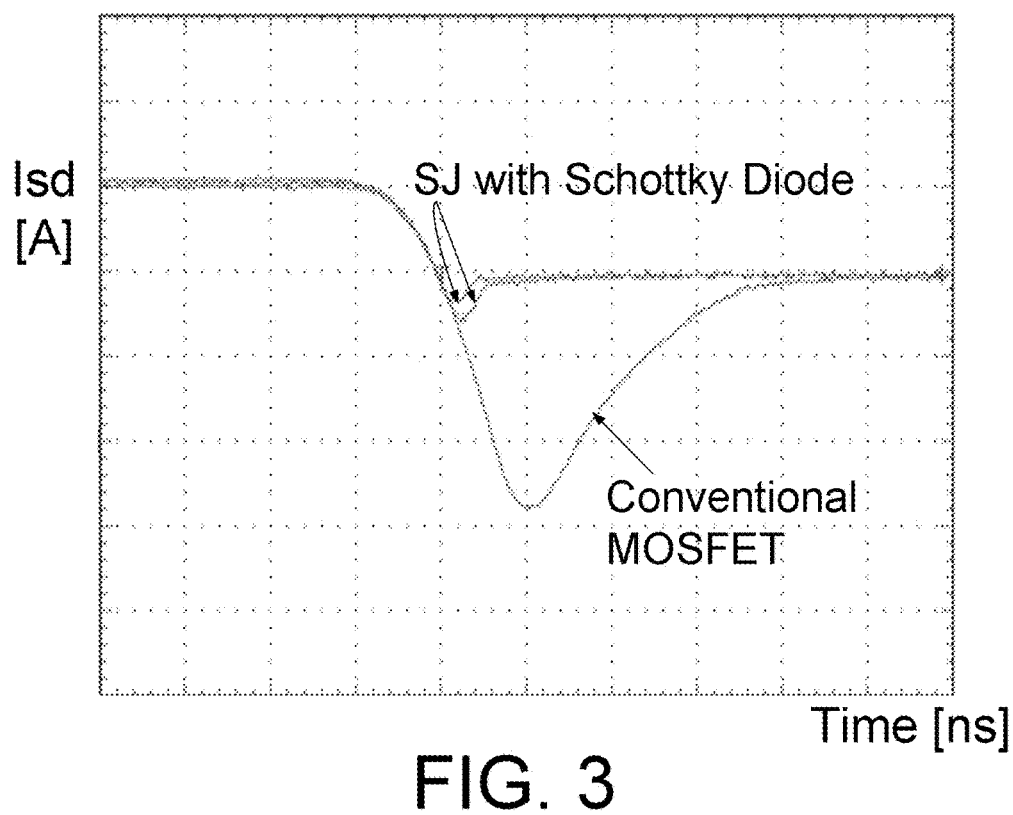
FIG. 3 illustrates a comparison on body diode reverse recovery currents of a conventional super junction power device and of a power device according to an embodiment.

FIG. 3 illustrates waveforms of body diode reverse recovery currents of a PN junction diode in a conventional super junction MOSFET device and of a vertical Schottky diode in a super junction MOSFET device (e.g., the power device 100). A reverse recovery current of the vertical Schottky diode is significantly smaller than the reverse recovery current of the PN junction diode in the conventional super junction MOSFET device. For example, the reverse recovery current of the vertical Schottky diode of the power device 100 may be as low as zero at drain current values of less than 6 A when only vertical Schottky diode turns on. Because a reverse recovery current induces extra losses in a MOSFET switch in a bridge circuit with inductive load, when the power device 100 with a vertical Schottky diode is used in such a bridge circuit, a turn-on loss of the power device 100 would be less than that of a conventional super junction MOSFET switch. Additionally, a gate-source voltage oscillation in the bridge circuit can be reduced and prevent MOSFET malfunction.

Figure 4A:
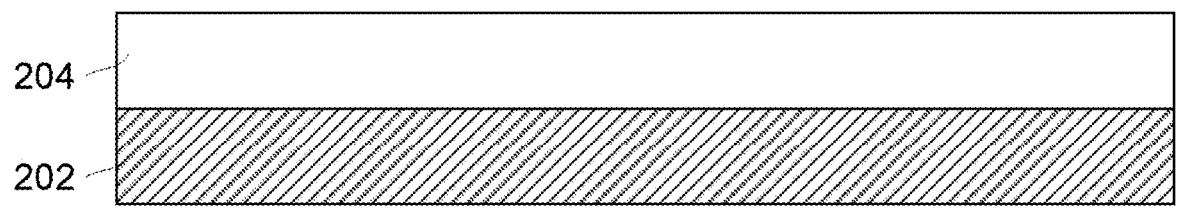
FIG. 4A to 4S illustrate a process of forming a power semiconductor device according to an embodiment.
Figure 4B:
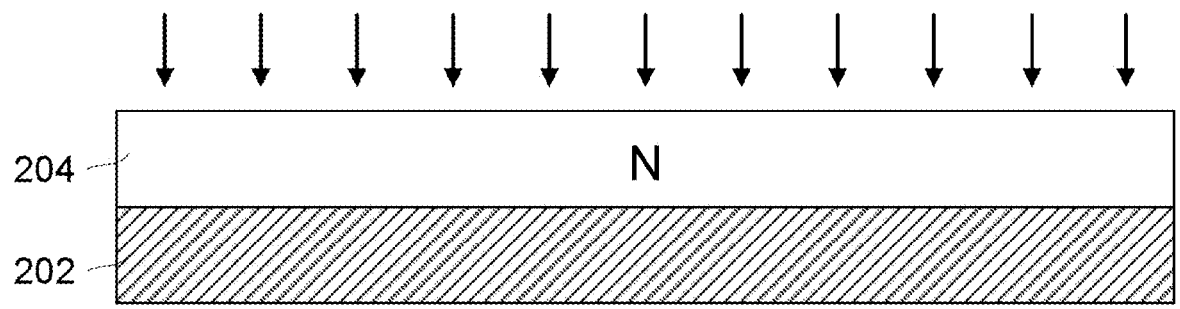
Figure 4C:
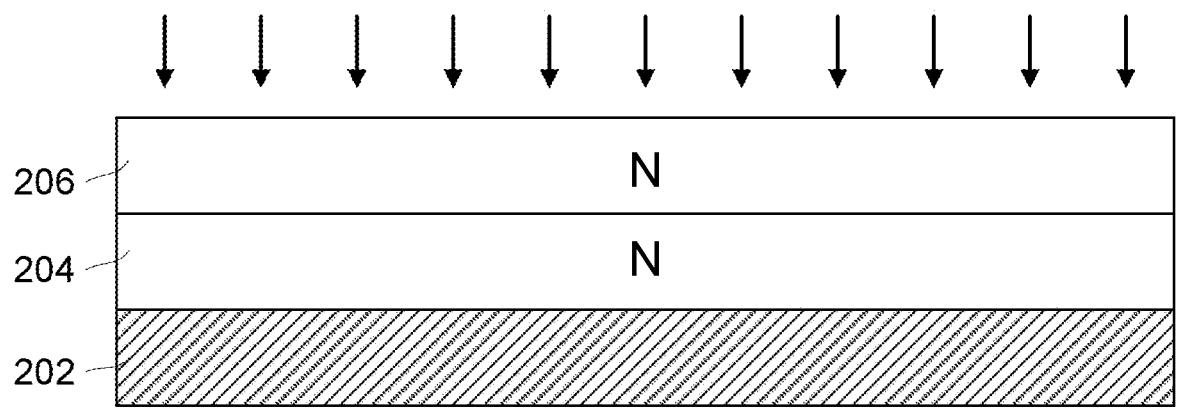
Figure 4D:
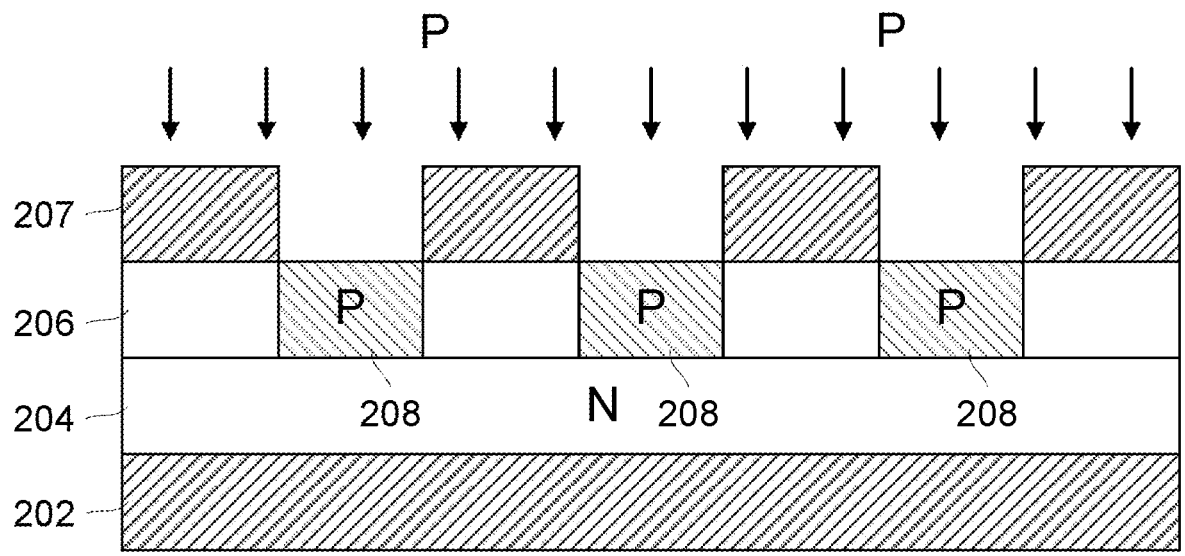
Figure 4E:
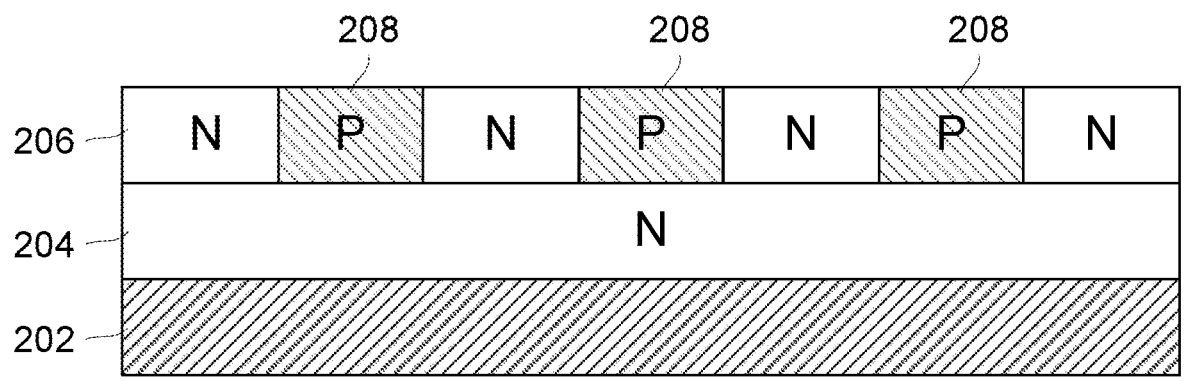
Figure 4F:
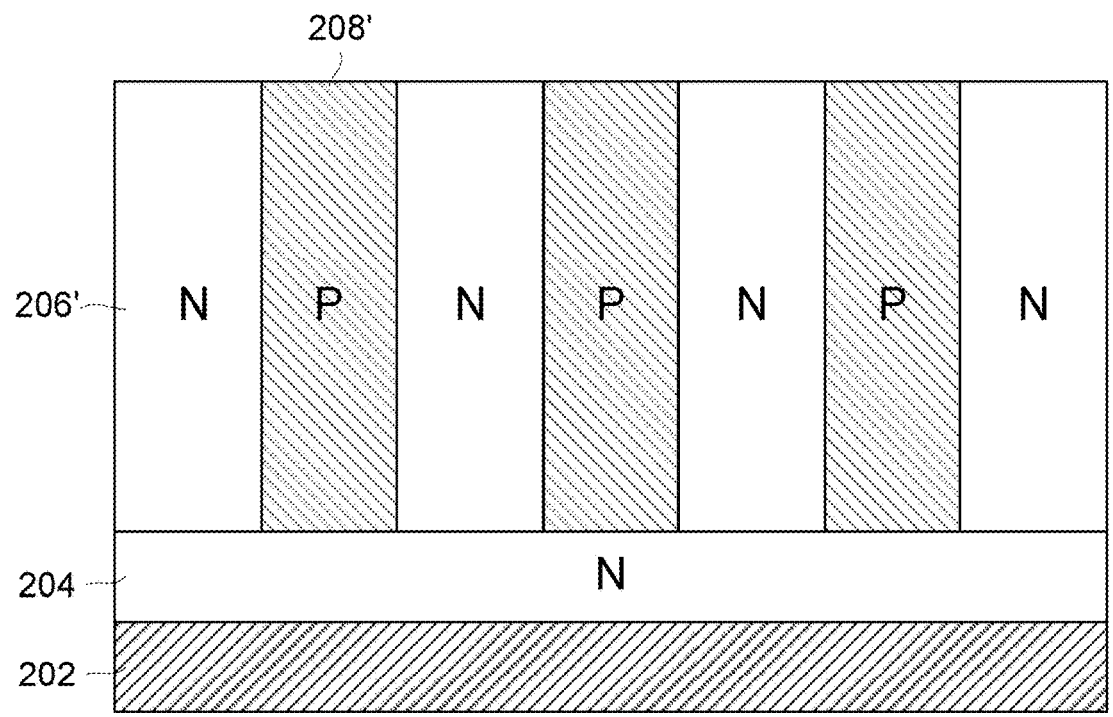
Figure 4G:
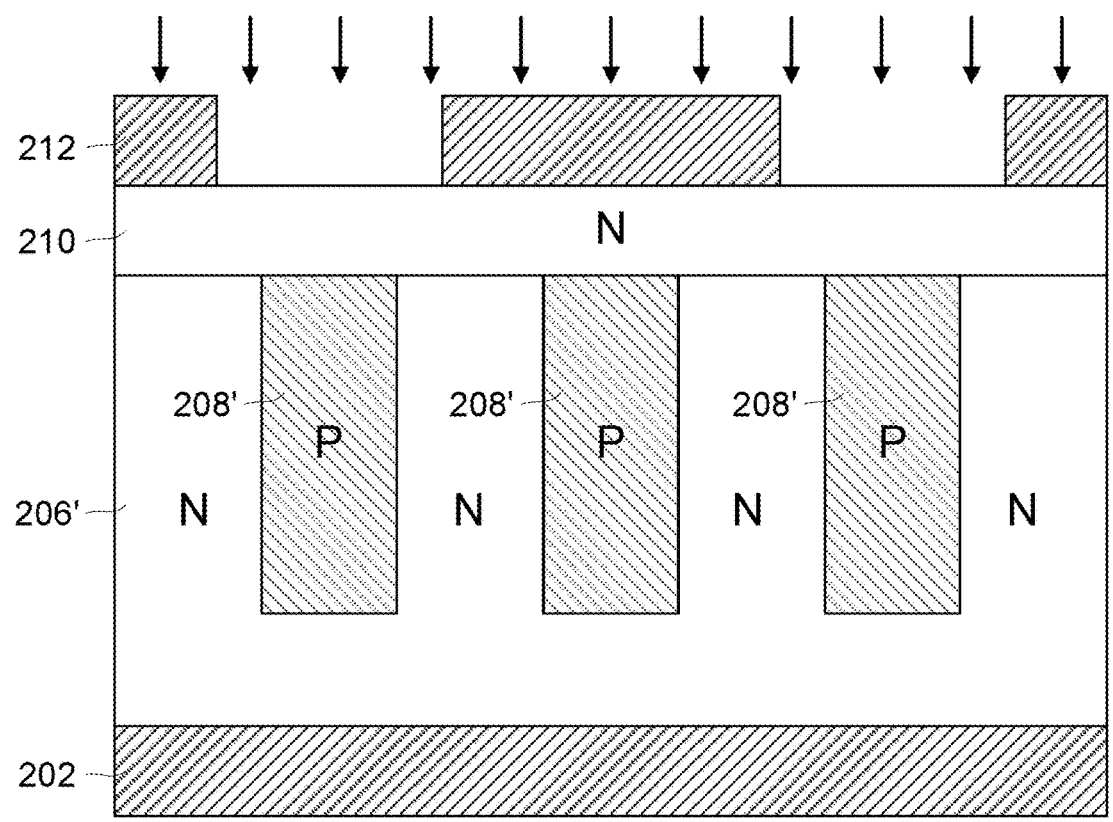
Figure 4H:
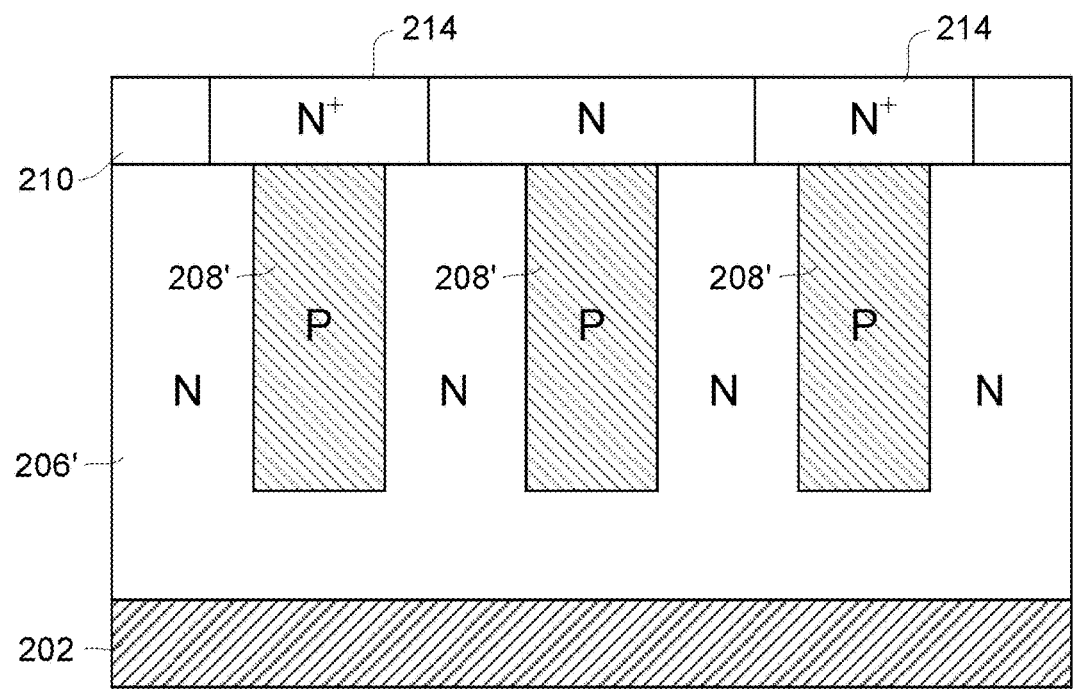
Figure 4I:
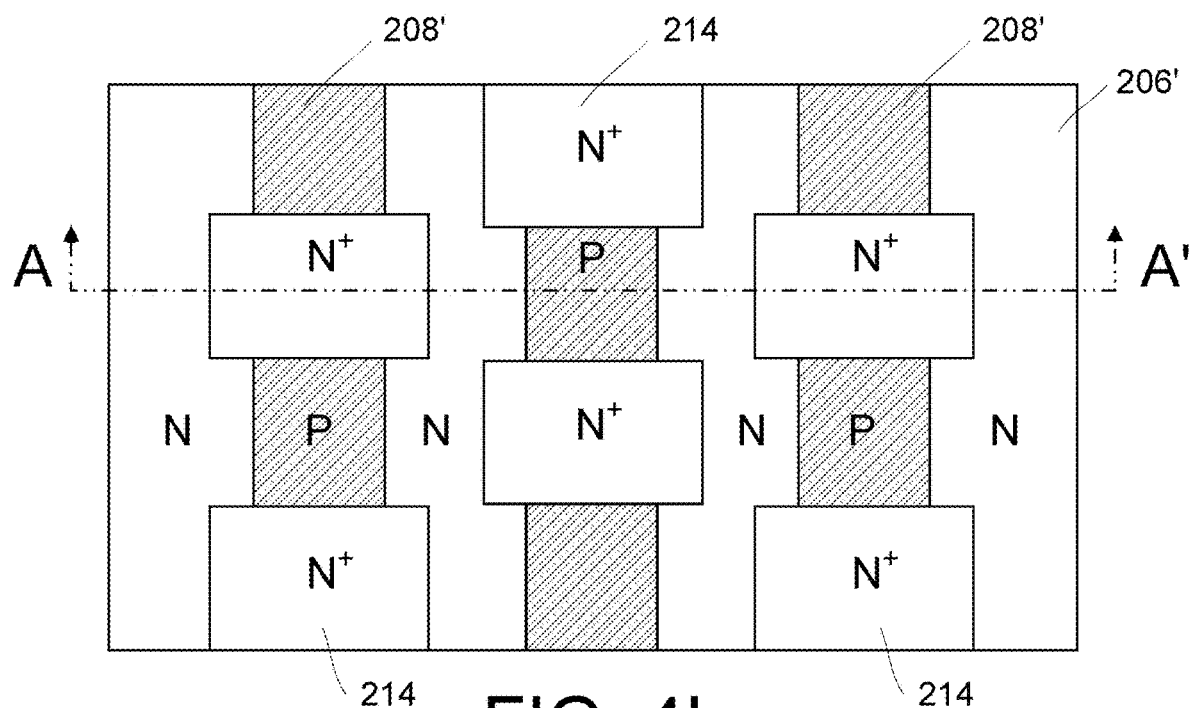
Figure 4J:
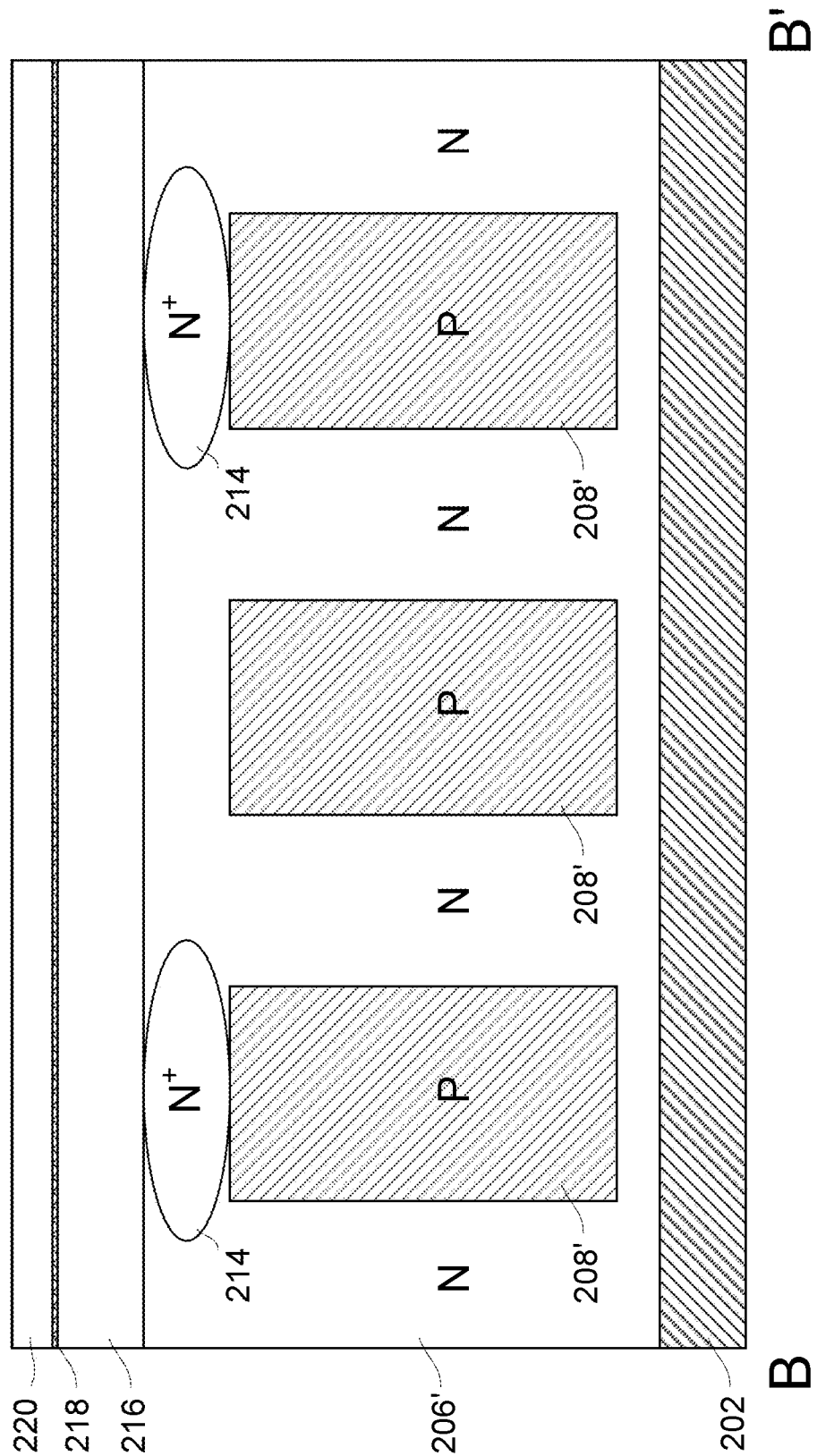
Figure 4K:
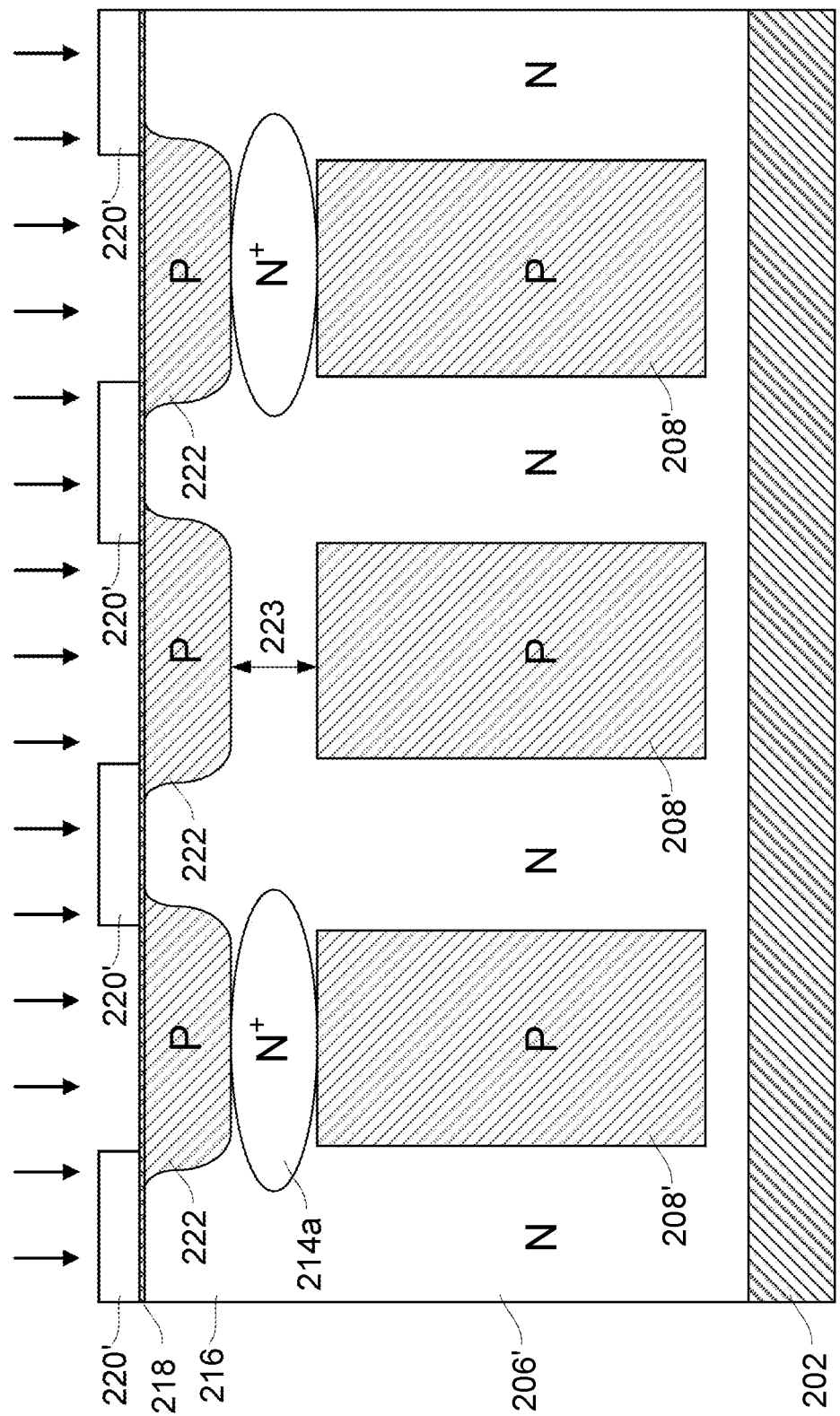
Figure 4L:
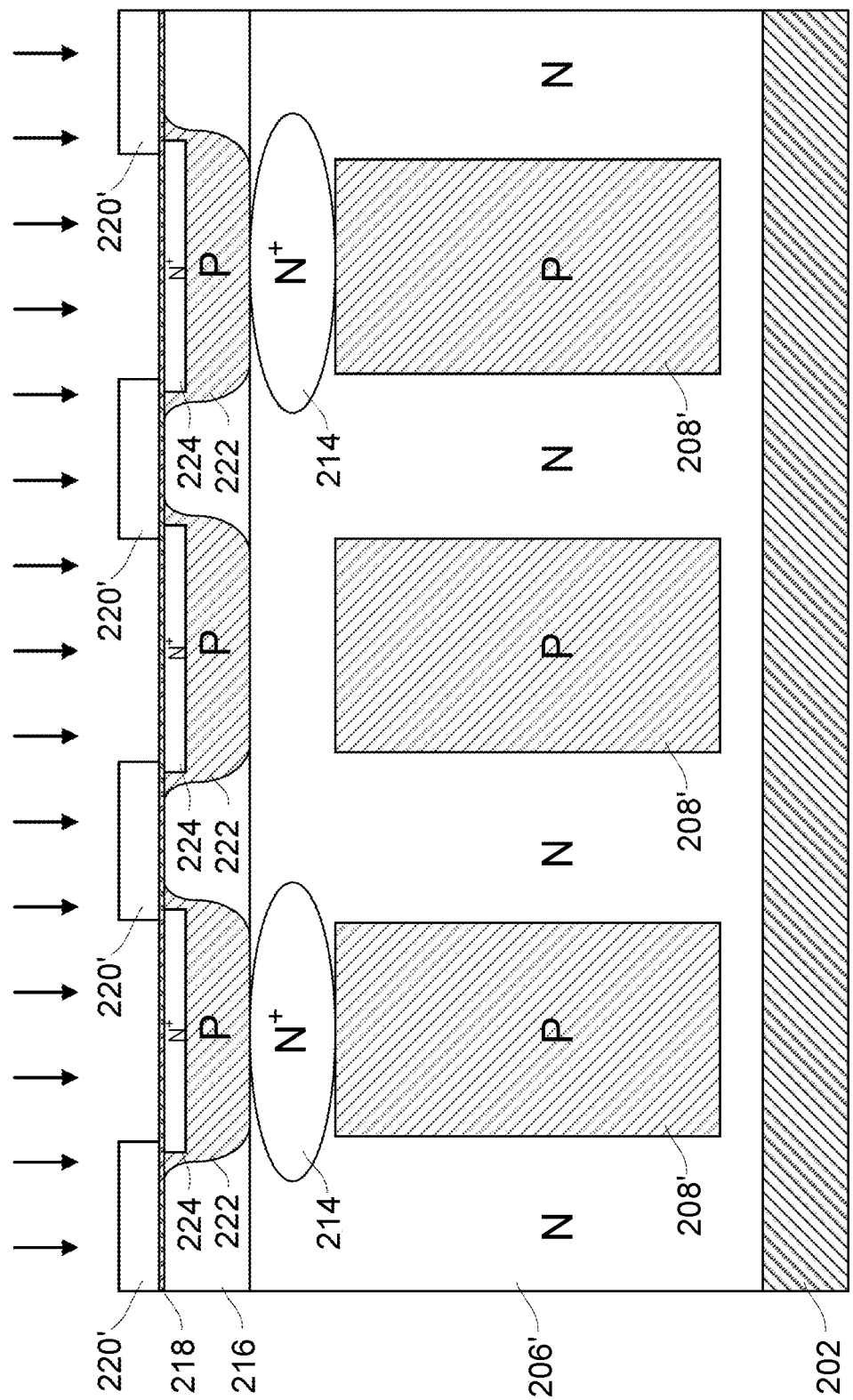
Figure 4M:
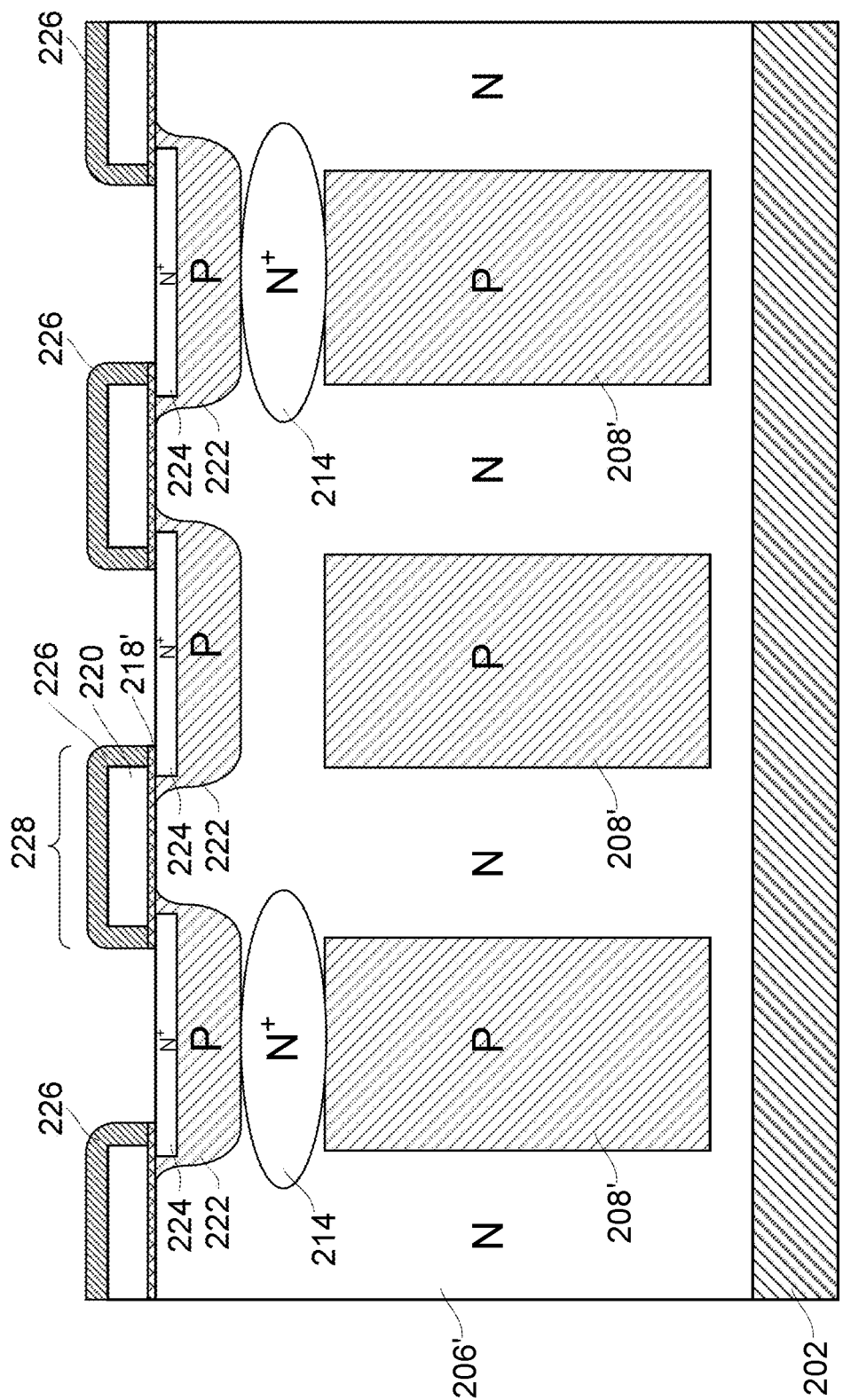
Figure 4N:
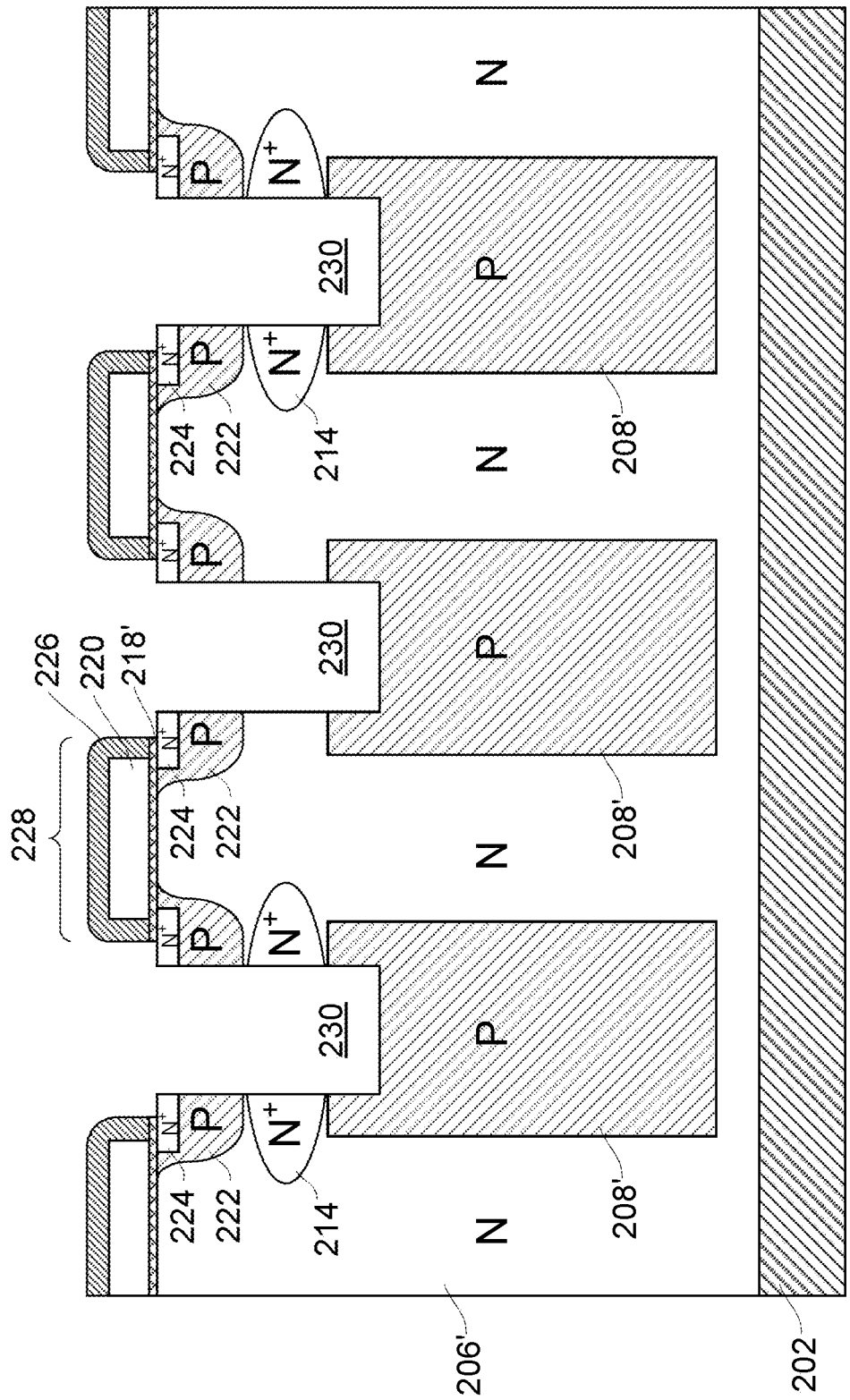
Figure 4O:
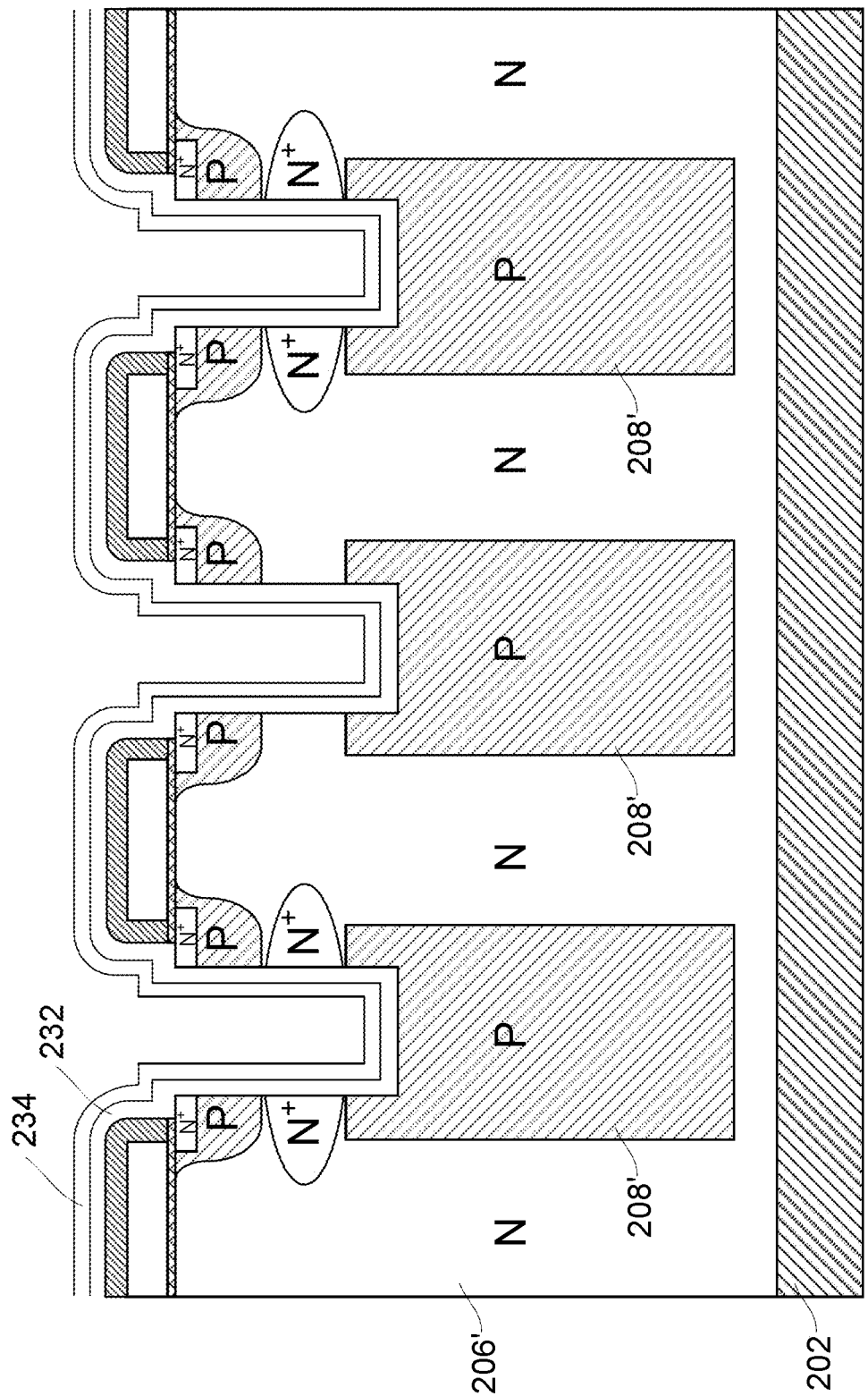
Figure 4P:
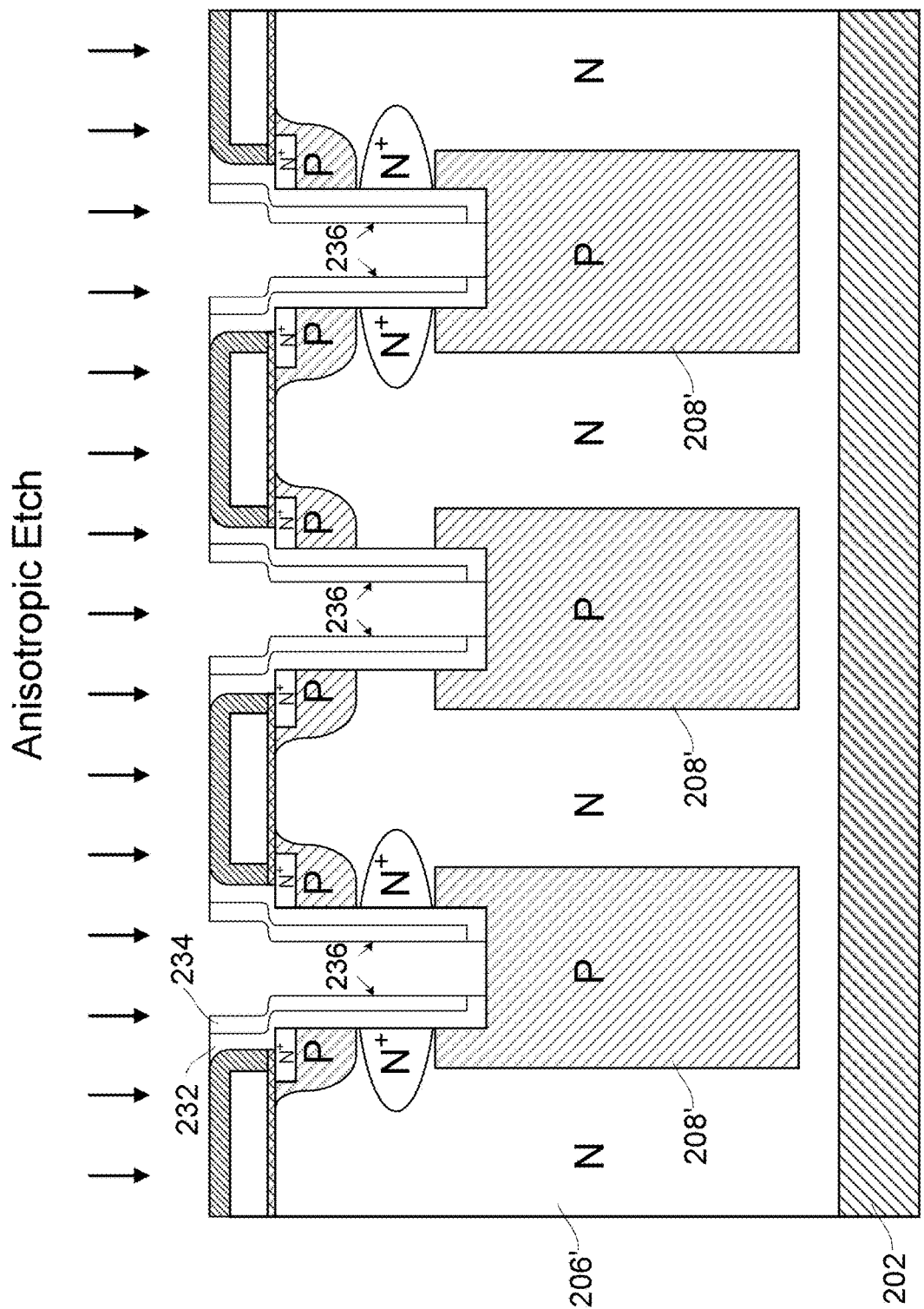
Figure 4Q:
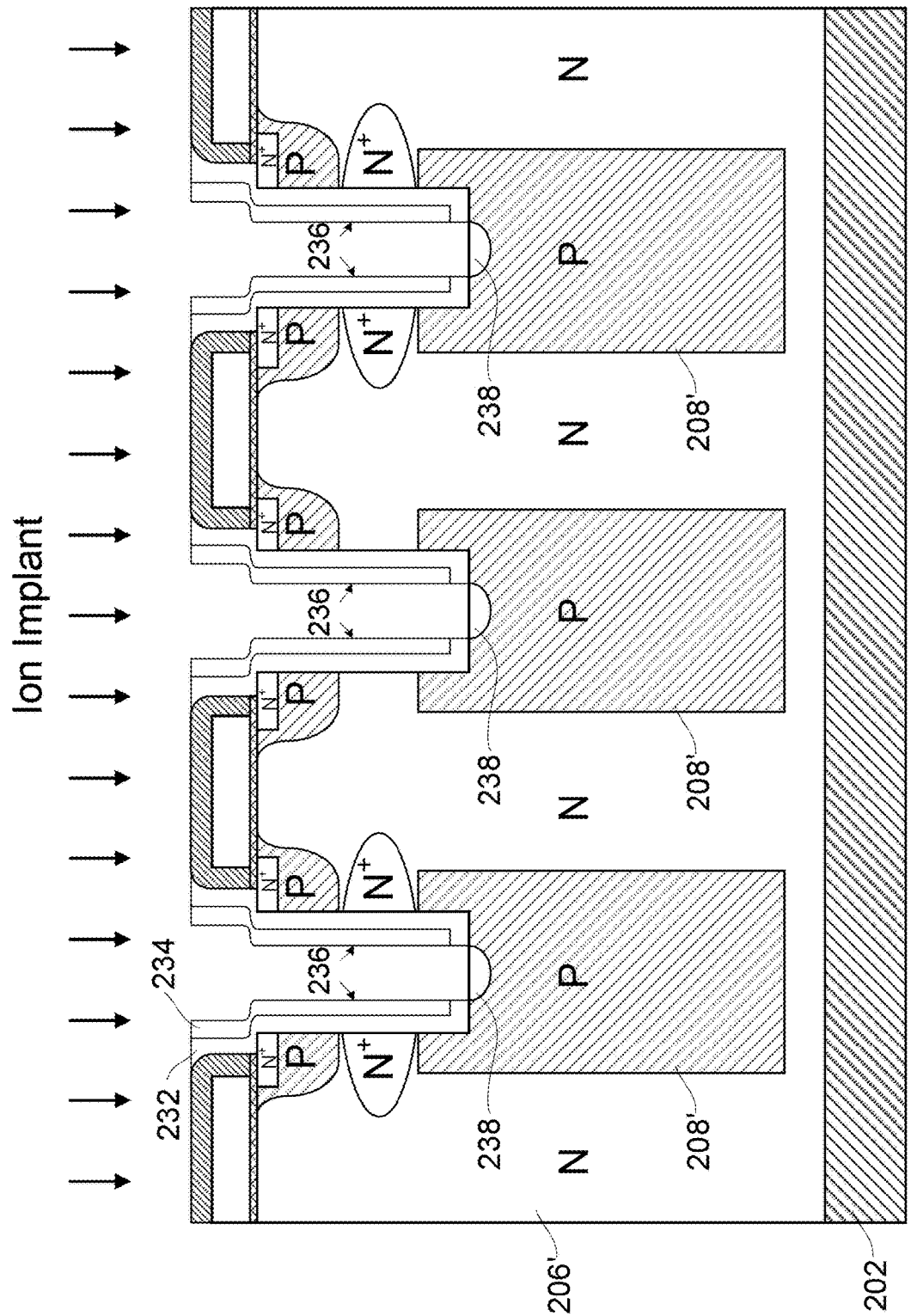
Figure 4R:
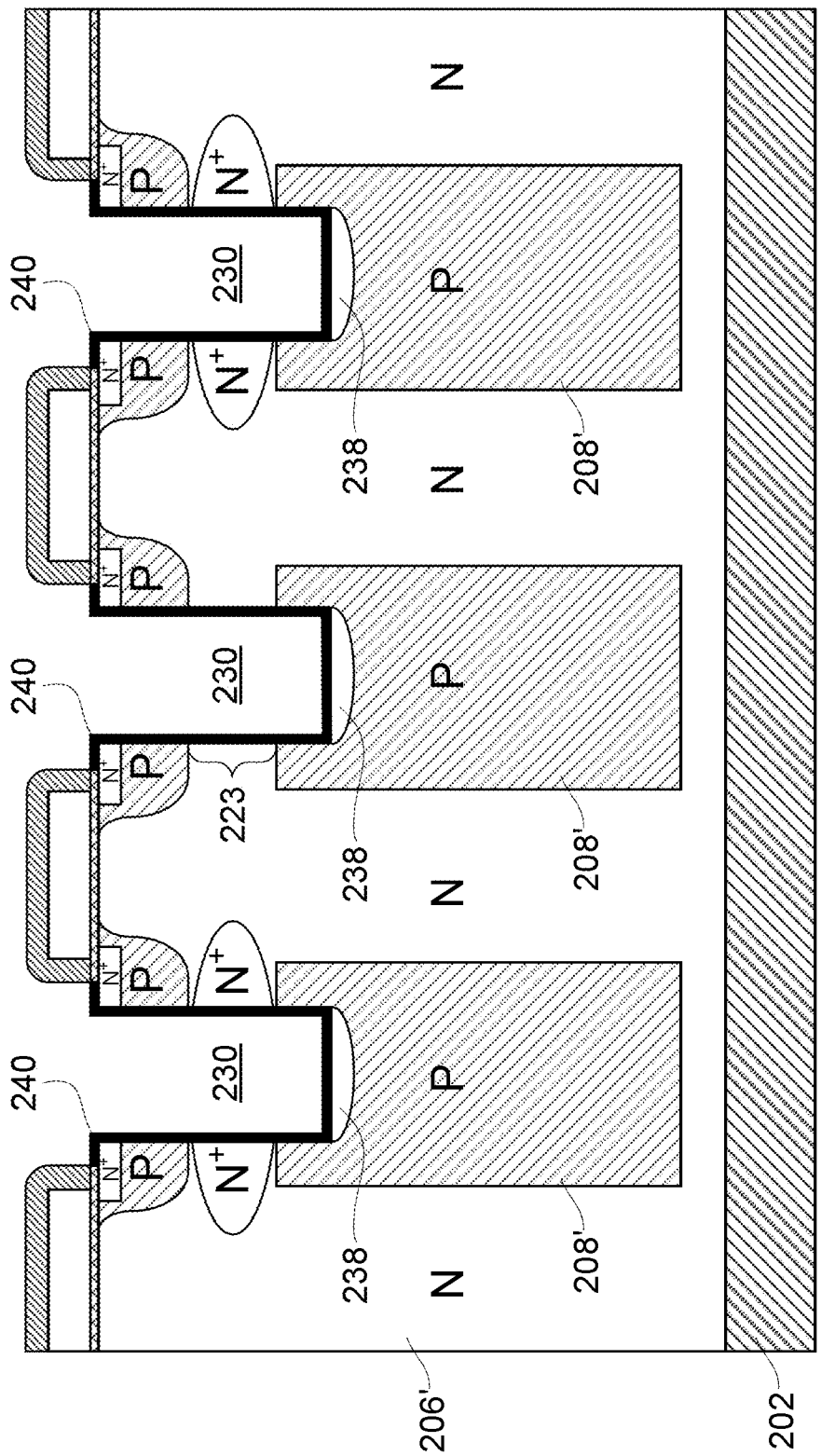
Figure 4S:
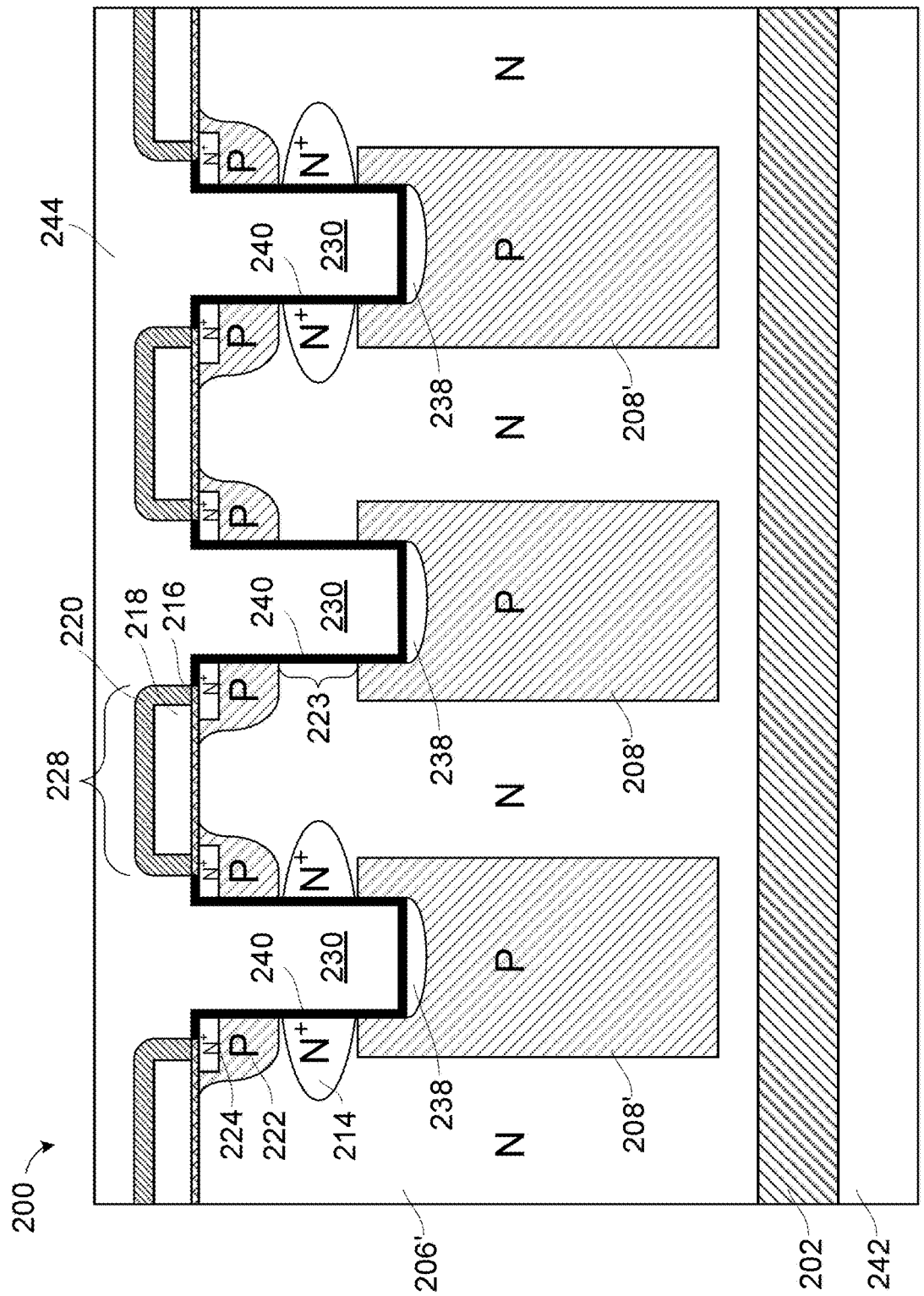

FIGS. 4A-4S illustrate aspects of a method of forming a semiconductor power device 200 in accordance with an embodiment of this disclosure.

In FIG. 4A, a semiconductor layer 204 is formed over a semiconductor substrate 202. The layer 204 may be formed by an epitaxial growth process. In an embodiment, the substrate 202 is silicon and each epitaxial growth step forms an epi layer having about 2.5 to 3.2 microns. In other embodiment, the substrate 202 may be other semiconductor materials, such as a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate.

The substrate 202 may include an epi layer. In an embodiment, the substrate 202 may be an N+ doped layer where the power device is a MOSFET. In another embodiment, the substrate 202 may be a P+ layer where the power device is an IGBT. The layer 204 is implanted with N type impurities (FIG. 4B) to convert the layer 204 to N type conductivity. Annealing may be performed to facilitate the diffusion of the impurities. In an embodiment, the layer 204 may be formed with the N type impurities so that the implantation step may be skipped.

A semiconductor layer 206 is formed over the layer 204 (FIG. 4C). The layer 206 is implanted with N type impurities, resulting in a structure with two N layers. Next, a patterned photoresist 207 is formed over the layer 206 (FIG. 4D), exposing selected portions of the layer 206. P type impurities (or ions) are selectively implanted into the exposed portions of the layer 206. These exposed portions of the layer 206 will be used to form the pillars (see numeral 122 in FIG. 1A). The P type impurities are provided with sufficient concentration to convert the exposed portions into a plurality of P regions 208. The photoresist 207 is removed (FIG. 4E). The above steps are repeated (e.g., 13-20 times) to obtain a layer 206' having a plurality of pillars 208' (FIG. 4F). The layer 206' include multiple epi layers. In an embodiment, the total depth (or vertical dimension) of the pillar 208' from top to base is greater than 20 microns, e.g., in the range of about 30 to 60 microns. Annealing process may be performed after ions are implanted on each epi layer to facilitate the dopant diffusion.

Next, a semiconductor layer 210 is formed over the entire structure and doped with N impurities (FIG. 4G). The layer 210 may a single epi layer or a multiple epi layers according to implementation. The layer 210 is formed to have a depth of 2-4. The layer 210 is provided with sufficient depth to form a gap whereon the Schottky contact is to be formed subsequently. The layer 210 is doped with N type impurities. A patterned photoresist 212 is formed to exposes portions of the layer 210.

In an embodiment, additional N doping is performed to provide higher N type concentration at selected portions of the layer 210, thereby forming a plurality of N+ enhancement regions 214 (FIG. 4H). The N+ enhancement regions 214 corresponds to the N+ enhancement regions 124 in FIG. 1. Doping concentration in the N+ enhancement regions 214 may be, for example, from about $1.2 \times 10^{16}$ to $5 \times 10^{17}$. The N+ enhancement regions 214 is formed to reduce the current leakage under reverse bias among other reasons. In the case where gaps between the P pillars 208' and subsequently formed P wells are not present where N+ enhancement regions 214 are absent (FIG. 1C), the overlap of the P pillars 208' and the subsequently formed P wells may be accomplished by means of an additional photomask and implant step in which the bridging implant region is formed only in areas outside the N+ enhancement regions 214. Alternately, the bridging implant region may be formed where N+ enhancement regions 214 are present and allow the N+ enhancement regions 214 to counter-dope the P pillars 208' to form the desired gap for the Schottky diode. The N+ enhancement regions 214 may or may not be formed according to implementation.

FIG. 4I shows a top view showing the N+ enhancement regions 214 and the pillars 208' according to an embodiment. The pattern of N+ enhancement regions 214 may be described as a checkerboard pattern over the pillars 208'. In other words, each contiguous pillar 208' of the device may have an alternating pattern of N+ enhancement regions 214 and N body doping regions along its length, while the pattern of N+ enhancement regions 214 is offset for each neighboring pillar 208'. The widths of the N+ enhancement regions 214 and the N body doping regions may be the same or similar, so that N+ enhancement regions 214 and N body doping regions are disposed in an alternating matrix, or checkerboard pattern, over the pillars 208'. Although the shape of the N+ enhancement region 214 in FIG. 4I is rectangular, embodiments are not limited to that specific shape. For example, the shape of the N+ enhancement regions 214 may be circular, hexagonal, or other shapes.

In an embodiment, the N+ enhancement regions 214 that are disposed over adjacent pillars 208' do not overlap one another with respect to a gate axis direction, or top-to-bottom direction of the drawing (see FIG. 4I). In other embodiments, the N+ enhancement regions 214 of adjacent pillars 208' overlap one another with respect to the gate axis direction. In yet another embodiment, one or more of N+ enhancement regions 214 may extend over the entire P pillar 210.

Referring to FIG. 4J, another layer 216 is formed over the N+ enhancement regions 214 by performing one or more epitaxial growth steps using the steps described above. The layer 216 has a depth of about 1-3 microns depending on implementation, or sufficient thickness to form a P well therein subsequently. A gate oxide layer 218 is formed over the layer 216. A gate electrode layer 220 is formed over the gate oxide layer 218. In an embodiment, the gate electrode layer is an N doped polysilicon, but may be other conductive material according to implementation.

The gate electrode layer 220 is etched to form a plurality of gate electrodes 220' using photolithography method which is well known in the art (FIG. 4K). Although FIG. 4K shows an intact gate oxide layer 218 in spaces between adjacent gate electrodes 220', some embodiments may include removing the gate oxide material provided between the gate electrodes 220'. P type dopants are implanted into the layer 216 using the gate electrodes 220' as a mask to form a plurality of P wells 222. Annealing may be performed to facilitate the diffusion of the dopants. The P wells 222 are formed to be spaced apart from the pillars 208', thereby providing a gap 223. That is, the bottom of the P wells 222 and the top of the pillars 208' define the gap 223 to have a vertical dimension of at least 1 micron in an embodiment. In another embodiment, the gap 223 is 2-4 microns, or 2-3 microns. The size of the gap defines the Schottky contact (or Schottky interface) for the Schottky diode so its size may vary according to implementation.

N type impurities are selectively implanted into the top of the P wells 222 using the gate electrodes 220' as a mask (FIG. 4L). Alternately, a photoresist mask can be used to pattern the implant. The N doping is controlled to create a plurality of N+ regions 224. In an embodiment, the N+ regions are source regions.

Referring to FIG. 4M, a gate dielectric layer (not shown) is formed over the gate electrode 220' and the N+ source regions 224. The gate dielectric layer may be formed by depositing one or more dielectric layers over the upper surface of device. The dielectric layers may include a nitride layer, an oxide layer, or other dielectric materials. In an embodiment, the dielectric layer is a nitride layer. The dielectric layer is selectively etched to remove portions of dielectric material disposed between the gate electrodes 220', resulting in a plurality of gate spacers 226. The gate spacers 226 define a plurality of gate structures 228. The gate structure 228 includes a gate oxide 218', a gate electrode 220', and a gate spacer 226.

A plurality of trenches 230 are formed over the pillars 208' and extend through the P wells 222 (FIG. 4N). The trenches are formed using known photolithography and anisotropic etch processes. In an embodiment, the trenches 230 extend into the pillars 208' by 1 micron to 8 microns.

An oxide layer 232 is formed over the trenches 230 (FIG. 4O). The oxide layer 232 may be formed using a deposition process or a thermal oxidation process and can have a thickness from 50-600 Angstroms. In an embodiment, the oxide layer 232 is formed globally on the entire structure including over the gate structures 228. A nitride layer 234 is formed over the oxide layer 232. In an embodiment, the nitride layer 234 has a thickness from 1000-2500 Angstroms.

An anisotropic etch is performed to expose the pillars 208' (FIG. 4P). The etch removes horizontally exposed portions of the nitride layer 234 and the oxide layer 232, including the bottom portions of the nitride layer 234 and the oxide layer 232 that are disposed over the bottom surface of the trenches 230. However, the nitride layer 234 and the oxide layer 232 remain on the sidewalls of the trenches 230 and the gate structures 228. In some embodiments, a thin portion of oxide layer 232 may remain at the bottom surface of the trenches 230. The remaining nitride and oxide layers serve as sidewall spacers 236 that protect the sidewalls of the trenches from a subsequent implantation step, which will be explained below. In an embodiment, a photoresist mask is formed over the gate structures 228 prior the anisotropic etch to protect the gates structures.

An ion implantation step is performed to form Ohmic contact regions 238 at the bottom of trenches 230 (FIG. 4Q), where portions of pillars 208' were exposed by the anisotropic etch above. In an embodiment, the Ohmic contact regions are doped with P type dopants to a concentration of at least $10^{19}$ atoms/cm$^3$. The Ohmic contact region 238 has a much higher conductivity than the body of pillars 208', which has a concentration of about $10^{16}$ atoms/cm$^3$.

The sidewall spacers 236 protect the sidewalls of the trenches 230 from the ions (or dopants) that may scatter during the implantation step. In an embodiment, a relatively low implantation energy, such as 3 to 25 keV may be used for the implantation step so that scattering ions would not have sufficient energy to penetrate the spacers 236 and be implanted into the sidewalls of the trench 230. Furthermore, a heavier implant species such as $BF_2$ may be used instead of boron to reduce the projected range of the implant if so desired. Alternatively, the thickness of the spacers 236 may be increased to prevent the scattering ions from penetrating the sidewalls of the trench 230. Or both the implantation energy and the thickness of the spacers 236 may be adjusted to prevent the scattering ions from penetrating into the sidewalls of the trench 230. If the P type dopants are implanted into the sidewalls of the trench, these dopants can dilute the N type conductivity of the sidewalls where Schottky contact will be made subsequently, which would degrade the performance of the Schottky diode.

After the ion implantation step, the nitride and oxide layers 234 and 232 that are remaining on the gate structures 228 and the trenches 230 are removed (FIG. 4R). In an embodiment, the nitride and oxide layers 234 and 232 are removed using a wet etch step. The wet etch is selected to dissolve the oxide layer 232 underlying the nitride layer. As a result, the nitride layer is lifted off from the structure. In such an embodiment, the gate spacer 226 is formed using a nitride layer to protect the gate structures.

A Schottky contact layer 240 is formed over the exposed surfaces of the trenches 230 (FIG. 4R). The Schottky contact layer 240 may formed by masking and selectively forming a Schottky metal material such as Molybdenum (Mo), Platinum (Pt), Vanadium (V), Titanium (Ti), Palladium (Pd), etc. In an embodiment, the Schottky contact layer is formed by forming a silicide material, such as platinum or palladium silicide. The Schottky contact layer 240 may also be a combination of a metal material and a silicide material. In an embodiment, Schottky contact layer 240 is formed conformally on the surfaces of the trenches 230. In an embodiment, although not shown, a barrier metal material such as titanium nitride may be formed over the surface of the Schottky material layer. The Schottky contact layer 240 makes a Schottky contact at the gap 223 defined by the P well 222 and the P pillar 208' to form a Schottky diode. A bottom portion of the Schottky contact layer 240 makes an Ohmic contact with the Ohmic contact region 238. This Ohmic contact facilitates the current flow therethrough.

A first electrode 242 is formed by depositing a conductive material such as aluminum over the substrate 202. In an embodiment, the first electrode 242 is a drain electrode (FIG. 4S). A second electrode 244 is formed by depositing a conductive material such as aluminum over the gate structures 228 and into the trenches 230. In an embodiment, the second electrode is a source electrode. A resulting device is a power semiconductor device 200 which corresponds to the power device 100 in FIG. 1. The power device 200 may be a power MOSFET, IGBT, or the like according to implementation.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, in another embodiment, the P pillars may be formed by a process that includes forming alternating epitaxial semiconductor and blocking layers, implanting impurities into the blocking layers, and diffusing the impurities from the blocking layers into the epitaxial semiconductor layers as described in U.S. application Ser. No. 15/454,861, which is incorporated by reference. Alternately, the P pillars may be formed by an entirely different method, such as etching a deep trench, incorporating a P type dopant in the trench, and filling the trench with some material such as monocrystalline silicon. Furthermore, methods of incorporating the P type dopant may include growth of doped epitaxial silicon inside the deep trench, angled ion implantation, plasma ion doping, diffusion from a solid source, atomic layer deposition, or some other doping technique. Similarly, although a planar gate structure was used in the previous embodiments, other types of gate structures are possible. In particular, a trench gate structure can be used instead of a planar gate structure. Accordingly, embodiments as set forth herein are intended to be illustrative and not limiting.

What is claimed is:

1. A method of forming a power semiconductor device, the method comprising:
   forming an epi layer over a substrate;
   forming a well at an upper portion of the epi layer;
   forming a pillar below the well and spaced apart from the well to define a Schottky contact region;
   etching a trench into the epi layer, the trench having a sidewall and a base, a portion of the sidewall of the trench corresponding to the Schottky contact region;
   forming a metal contact layer over the sidewall and the base of the trench, the metal contact layer forming a Schottky interface with the epi layer at the Schottky contact region; and
   forming a gate electrode and first and second electrodes.

2. The method of claim 1, further comprising:
   forming an insulating layer over the trench, the insulating layer covering the sidewall and the base of the trench;
   etching the insulating layer to remove a first portion of the insulating layer overlying the base of the trench while leaving a second portion of the insulating layer covering the sidewall of the trench, thereby exposing a portion of the pillar; and
   implanting ions into the exposed portion of the pillar to form an Ohmic contact region,
   wherein the metal contact layer makes an Ohmic contact with the Ohmic contact region, and the second portion of the insulating layer remaining on the sidewall of the trench serves to protect the sidewall of the trench from scattering ions during the implanting.

3. The method of claim 2, wherein the power semiconductor device is a MOSEFT and the pillar is a super junction pillar.

4. The method of claim 2, wherein the ions are implanted with an energy level that is not sufficient to penetrate the second portion of the insulating layer remaining on the sidewall of the trench.

5. The method of claim 4, wherein the energy level is in a range from 3 keV to 25 keV.

6. The method of claim 2, wherein the Ohmic contact region has the same conductivity type as that of the pillar and a doping concentration of the Ohmic contact region is greater than that of the pillar.

7. The method of claim 1, further comprising:
   forming an enhancement region between the well and the pillar, and adjacent to the sidewall of the trench.

8. The method of claim 7, wherein a doping concentration in the enhancement region is from $1.2 \times 10^{16}$ cm$^{-3}$ to $5 \times 10^{17}$ cm$^{-3}$.

9. The method of claim 7, wherein the pillar is a first pillar and the enhancement region is a first enhancement region, the first pillar extending in a first direction when seen in a top view, the method further comprising:
   forming a second enhancement region over a second pillar neighboring the first pillar in a second direction perpendicular to the first direction.

10. The method of claim 9, wherein the first enhancement region and the second enhancement region do not overlap each other with respect to the first direction.

11. The method of claim 1, wherein a gap that defines the Schottky contact region is in a range from 1 µm to 5 µm.

12. The method of claim 1, wherein the trench is etched to extend into the pillar by a given distance, the given distance being in a range from 1 µm to 8 µm.

13. The method of claim 1, wherein the pillar has a vertical dimension of at least 20 µm.

14. A method of forming a power semiconductor device, the method comprising:
   forming a first layer that has a pillar over a substrate;
   forming a second layer over the first layer;
   forming a well in the second layer;
   forming a trench over the pillar, the trench having a sidewall and a base, a portion of the sidewall of the trench corresponding to a gap that defines a distance between the well and the pillar;
   forming a metal contact layer over the sidewall and the base of the trench, the metal contact layer forming a Schottky interface at the portion of the sidewall of the trench; and
   forming first and second electrodes over the metal contact layer.

15. The method of claim 14, further comprising:
   forming an insulating layer over the trench, the insulating layer covering the sidewall and the base of the trench;
   etching the insulating layer to remove a first portion of the insulating layer overlying the base of the trench while leaving a second portion of the insulating layer covering the sidewall of the trench, thereby exposing a portion of the pillar; and
   implanting ions into the exposed portion of the pillar to form an Ohmic contact region,
   wherein the metal contact layer makes an Ohmic contact with the Ohmic contact region, and the second portion of the insulating layer remaining on the sidewall of the trench serves to protect the sidewall of the trench from scattering ions during the implanting.

16. The method of claim 14, further comprising:
forming a third layer over the first layer; and
forming an enhancement region in the third layer.

17. The method of claim 16, wherein the third layer has a sufficient depth to form the gap between the well and the pillar.

18. The method of claim 14, further comprising forming a gate electrode over the second layer,
wherein the well is formed in the second layer using the gate electrode as a mask.

19. The method of claim 14, wherein the gap that defines the distance between the well and the pillar is in a range from 1 μm to 5 μm.

20. The method of claim 14, wherein the trench is formed to extend into the pillar by a given distance, the given distance being in a range from 1 μm to 8 μm.

21. A method of forming a power semiconductor device, the method comprising:
forming a well at an upper portion of an epi layer formed over a substrate;
forming a pillar below the well and spaced apart from the well to define a Schottky contact region;
etching a trench into the epi layer, the trench having a sidewall and a base, a portion of the sidewall of the trench corresponding to the Schottky contact region;
forming a metal contact layer over the sidewall and the base of the trench, the metal contact layer forming a Schottky interface with the epi layer at the Schottky contact region; and
forming a gate electrode and first and second electrodes.

* * * * *